(12) United States Patent
Kimoto et al.

(10) Patent No.: US 6,291,072 B1
(45) Date of Patent: Sep. 18, 2001

(54) INSULATING FILM FOR SEMICONDUCTOR DEVICE AND SEMICONDUCTOR DEVICE

(75) Inventors: Hisao Kimoto, Kanagawa; Tsutomu Mochizuki, Chiba, both of (JP)

(73) Assignees: Kishimoto Sangyo Co., Ltd., Osaka; Daisankasei Co., Ltd., Tokyo, both of (JP)

( * ) Notice: Subject to any disclaimer, the term of this patent is extended or adjusted under 35 U.S.C. 154(b) by 0 days.

(21) Appl. No.: 09/228,970

(22) Filed: Jan. 12, 1999

(30) Foreign Application Priority Data

Jun. 15, 1998 (JP) .................................................. 10-183376

(51) Int. Cl.[7] .............................. B32B 27/00; H01L 23/00
(52) U.S. Cl. ...................... 428/422; 428/141; 428/451; 428/461; 428/500; 257/632; 257/642; 427/255.14
(58) Field of Search ..................................... 428/421, 422, 428/500, 620, 461, 451, 141; 528/396; 257/632, 642, 759

(56) References Cited

U.S. PATENT DOCUMENTS

| | | | |
|---|---|---|---|
| 3,332,891 | * | 7/1967 | Chow et al. .......................... 528/391 |
| 3,945,823 | * | 3/1976 | Parent et al. .......................... 430/100 |
| 3,947,371 | * | 3/1976 | Parent et al. .......................... 430/108 |
| 4,225,647 | * | 9/1980 | Parent et al. .......................... 428/336 |
| 4,783,561 | * | 11/1988 | Pregaglia et al. ..................... 570/183 |
| 4,925,712 | * | 5/1990 | Cicuta et al. ......................... 428/35.7 |
| 5,024,879 | * | 6/1991 | Massa et al. .............................. 264/4 |
| 5,096,849 | * | 3/1992 | Beilstein, Jr. et al. ................. 437/67 |
| 5,310,858 | * | 5/1994 | Greiner et al. ........................ 528/271 |

FOREIGN PATENT DOCUMENTS

406112336A * 4/1994 (JP) .
WO 97/15541 * 5/1997 (WO) .

OTHER PUBLICATIONS

Takahito Itoh, et al., Journal of Polymer Science: Part A: Polymer Chemistry, vol. 33, pp. 359–363, "Synthesis of 1,1,9,9–Tetrafluoro[2.2]paracyclophane and Its Polymerization by Vapor Deposition Method", 1995 (no month).

Alphametals, 2 pages, "Parylene VIP™ AF–4", 1996 (no month).

* cited by examiner

Primary Examiner—Deborah Jones
Assistant Examiner—Stephen Stein
(74) Attorney, Agent, or Firm—Oblon, Spivak, McClelland, Maier & Neustadt, P.C.

(57) ABSTRACT

A semiconductor device is provided with an interlayer insulating film consisting essentially of poly-$\alpha,\alpha$-difluoroparaxylylene. The interlayer insulating film can have a low relative dielectric constant of from 2.1 to 2.7.

8 Claims, 6 Drawing Sheets

400nm

200nm

1 μm

1 μm

200nm

INSULATING FILM FOR SEMICONDUCTOR DEVICE AND SEMICONDUCTOR DEVICE

FIELD OF THE INVENTION

The present invention relates to an interlayer insulating film formed on a production process of a semiconductor device, and a semiconductor device using the interlayer insulating film.

BACKGROUND OF THE INVENTION

Miniaturization of circuit patterns, low power consumption and high-speed operation of semiconductor devices proceed, and therefore low capacitance and low resistance of the circuit patterns are spread. As one means of ensuring high-speed and normal operation of the circuit, there has been considered to lower a dielectric constant of an interlayer insulating film.

An insulating film containing a carbon atom, such as an amorphous carbon film, an organic compound insulating film containing a fluorine atom, and an inorganic insulating film have drawn attention as an insulating film having a low dielectric constant. However, must satisfy the following requirements to become a substitute of a silicon oxide insulating film, which is most frequently employed at the present. That is, they must have:
1) Low dielectric constant, and also the following characteristics, which are basically required for a semiconductor insulating film:
2) Good adhesion,
3) Good workability,
4) Good in step coverage
5) Good in gap fill property,
6) Low water absorption
7) Capability of coping with a damascene process (embedded wiring).

However, no material has been known that has a low dielectric constant and satisfies all the characteristics required for an interlayer insulating film of a semiconductor device.

SUMMARY OF THE INVENTION

An object of the invention is to provide an insulating film having a low dielectric constant and exhibiting performance that is sufficient as an interlayer insulating film of a semiconductor device, and also provide a semiconductor device using the insulating film.

The object of the invention can be accomplished by the following constitutions of the invention.
(1) An insulating film for a semiconductor device used as an interlayer insulating film of a semiconductor device, the insulating film consisting essentially of poly-α,α-difluoroparaxylylene and having a relative dielectric constant of from 2.1 to 2.7.
(2) An insulating film for a semiconductor device used as an interlayer insulating film of a semiconductor device, the insulating film consisting essentially of poly-α,α-difluoroparaxylylene and exhibiting a step coverage of from 0.4 to 0.9.
(3) An insulating film for a semiconductor device capable of being filled in a gap, the insulating film consisting essentially of poly-α,α-difluoroparaxylylene, having a ratio (D/L) of a depth (D) and an opening width (L) of 1 or more.
(4) An insulating film for a semiconductor device as in one of the constitutions (1) to (3), wherein a shape of the insulating film is capable of being patterned by irradiation of oxygen plasma.
(5) A semiconductor device comprising a semiconductor substrate having thereon at least two conductive layers through an interlayer insulating film, the interlayer insulating film is an insulating film as in one of the constitutions (1) to (4).

DETAILED DESCRIPTION OF THE INVENTION

The insulating film of the invention consists essentially of poly-α,α-difluoroparaxylylene represented by the following structural formula (I):

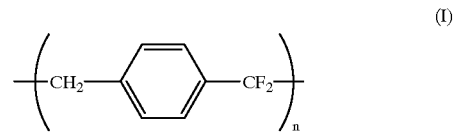

In the structural formula (I), n represents a polymerization degree. The polymerization degree n of the poly-α,α-difluoroparaxylylene used in the invention is generally 1,000 or more, and particularly 5,000 or more.

The poly-α,α-difluoroparaxylylene can be formed by the CVD (chemical vapor deposition) process using tetrafluoro-[2,2]-paracyclophane represented by the following structural formula (II) as a raw material:

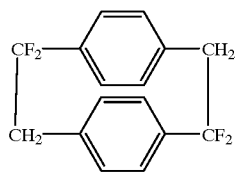

(II)

The synthesis of poly-α,α-difluoroparaxylylene represented by the structural formula (I) by the CVD (chemical vapor deposition) process using tetrafluoro-[2,2]-paracyclophane represented by the following structural formula (II) as a raw material has been known as disclosed in Unexamined Published Japanese Patent Application No. 9-25252. However, the publication only discloses the effect in that a coating film can be formed that is excellent in heat resistance and is expected to have good balance in all the physical properties. In the invention, on the other hand, a poly-α,α-difluoroparaxylylene film is produced under various conditions and examined for properties and characteristics, and thus it has been found that the film is suitable as an interlayer insulating film for a semiconductor device.

Figure 1:
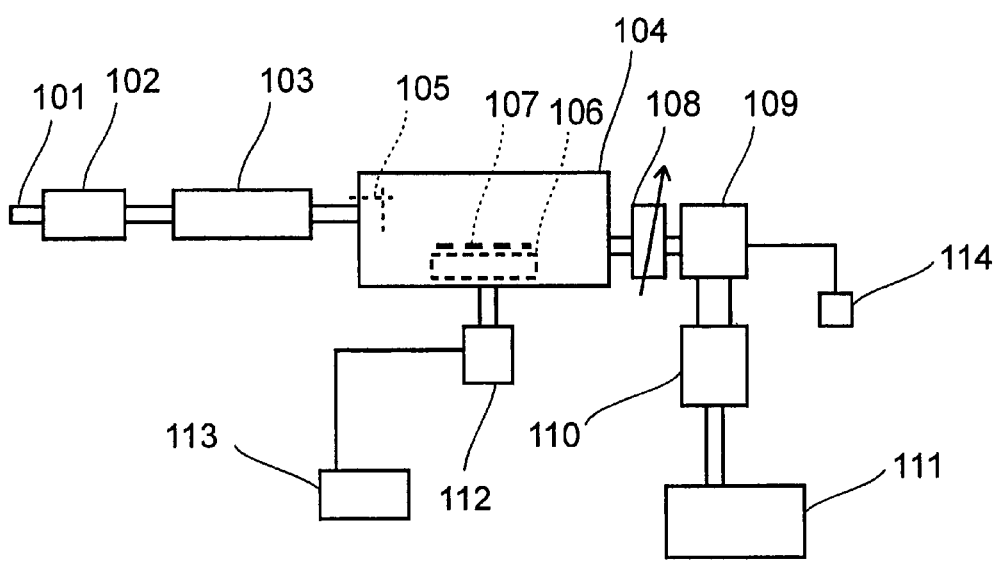
FIG. 1 is a diagrammatic front view of a constitutional example of a LPCVD (Low Pressure Chemical Vapor Deposition) apparatus used for formation of an insulating film of the invention.

A constitutional example of a LPCVD apparatus used for formation of an insulating film of the invention is shown in FIG. 1. On producing the insulating film, tetrafluoro-[2,2]-paracyclophane in the form of a dimer as a raw material is put in an evaporation chamber 102 through an inlet 101. In the evaporation chamber 102, the raw material is evaporated to be a dimer gas. The evaporation chamber 102, and a decomposition chamber 103 and a sample chamber 104 connected thereto have different vacuum degrees by a turbo molecular pump 110 and a rotary pump 111, and therefore the dimer gas is introduced into the decomposition chamber 103 and heated by a heater to be a monomer gas, which is then introduced into the sample chamber 104. In the sample chamber 104, a polymerization reaction occurs on the surface of a sample 107 placed on a susceptor 106, and a polymer is accumulated to form an insulating film. The susceptor 106 can be rotated by a motor 112, and its temperature can be controlled by a cooler 113. The sample 107 is generally a semiconductor wafer. The monomer gas that does not contribute to the polymerization and accumulation is introduced to a cooling trap 109 through a vacuum conductance valve 108. The cooling trap 109 is cooled by a cooler 114, and the monomer gas is solidified therein and recovered.

In LPCVD apparatus having such a constitution, the characteristics and the formation rate of the insulating film can be controlled by adjusting the opening ratio of a shutter 105 for exhaust adjustment provided between the sample chamber 104 and the decomposition chamber 103, the opening ratio of the vacuum conductance valve 108, and the rotation number and the temperature of the susceptor 106.

In the invention, the conditions for accumulation of the insulating film are preferably controlled to the following ranges:
Heating temperature in the evaporation chamber 102: 80 to 180° C.
Heating temperature in the decomposition chamber 103: 600 to 750° C.
Pressure on accumulation of the insulating film in the sample chamber 104: 1 to 10 Pa, preferably 3 to 6 Pa
Rotation number of the susceptor 106: 0 to 10 rpm
Temperature of the susceptor 106: −60 to 60° C., preferably −60 to 0° C., more preferably −60 to −20° C.

When the temperature of the susceptor 106 (temperature of the substrate) is low, it is preferred since the growing rate of the film is high, the film is liable to be dense, and the yield is improved. The pressure on accumulation of the insulating film in the sample chamber 104 is important for forming a dense insulating film. When the pressure is too high, it is difficult to form a dense insulating film. On the other hand, when it is too low, the growing rate of the film becomes low, and the productivity is deteriorated.

By controlling the accumulation conditions to the above-described ranges, characteristics suitable as an interlayer insulating film for a semiconductor device as shown in the following (1) to (7) can be obtained:

(1) The dielectric constant can be in the range of from 2.1 to 2.7. The dielectric constant of a silicon oxide insulating film is generally 3.9, and the dielectric constant of a silicon oxide insulating film containing fluorine is generally from 3.3 to 3.6.

(2) A strong adhesive power to a metallic conductive layer, an inorganic insulating layer and a semiconductor substrate can be realized.

(3) The shape of the insulating film can be worked by ashing by oxygen plasma irradiation.

(4) The step coverage can be in the range of from 0.4 to 0.9.

(5) Good gap fill property can be obtained.

(6) Water absorption can be lowered.

(7) A damascene process on the production of a semiconductor device can be applied.

The above-described characteristics are described in more detail.

As described in item (1), the dielectric constant of the insulating film of the invention can be low. Thus, when it is applied for an interlayer insulating film of a semiconductor device having a fine circuit pattern, the capacitance is lowered, and high-speed and normal operation can be ensured. Specifically, it is suitable as an interlayer insulating film in a device of a wiring design rule of a minimum line width of 1 $\mu$m or less.

As described in item (3), the insulating film of the invention can be removed by ashing by oxygen plasma irradiation. Specifically, because sufficient selectivity can be ensured between a resist mask and a hard mask on the oxygen plasma ashing, the insulating film can be easily patterned by ashing.

Figure 2:
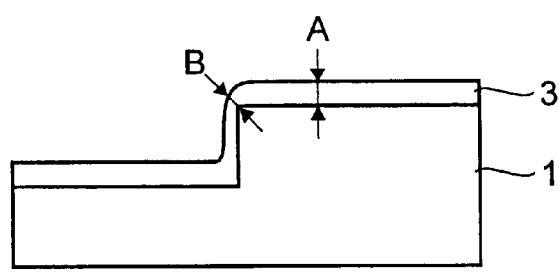
FIG. 2 is an explanatory diagram of calculation of a step coverage.

The calculation method of the step coverage in item (4) is explained with reference to FIG. 2. FIG. 2 shows a state in that an insulating film 3 is accumulated on a substrate 1 having a step structure. The step coverage is expressed by B/A, where A represents the thickness of the insulating film 3 at the upper surface of the step, and B represents the minimum thickness of the insulating film 3 at the edge part of the step.

The gap fill property shown in item (5) shows the capability of filling in a gap, such as a groove and a hole present between electrode layers. When the aspect ratio of the gap becomes high, it is generally difficult to fill the insulating film in the gap without forming any defect such as voids or pinholes. Therefore, the insulating film that can be filled in a gap having a high aspect ratio is excellent in gap fill property. The aspect ratio is expressed by D/L, where D represents the depth of the gap, and L represents the opening width of the gap. When the gap is in the form of a hole, the opening width L means its via-hole diameter (short diameter). The insulating film of the invention has high gap fill property due to high flowability on film formation, and can be filled with substantially no defect, for example, in a gap having a D/L of 1 or more. Furthermore, it can be easily filled in a gap having a high aspect ratio of from 3 to 10. It can be applied to a fine wiring pattern where L is 0.25 $\mu$m or less, and also can be applied to an extremely fine wiring pattern where L is from 0.1 to 0.18 $\mu$m.

Since the insulating film of the invention is excellent in step coverage and gap fill property, an insulating film having a uniform thickness with no voids can be formed even in a step part and an uneven part having a narrow opening and a high aspect ratio. The insulating film excellent in gap fill property is advantageous on embedding of a capacitance between capacitor electrodes and flattening of various steps in a semiconductor device.

Because the insulating film of the invention has an extremely low water absorption as shown in item (6), it substantially does not adsorb water when it is allowed to stand in the air after formation. Since the insulating film immediately after forming by the CVD process is soft, it is generally hardened by annealing, and water absorption after annealing is also extremely low. Accordingly, the water absorption does not change by heat history. The annealing is generally conducted by heating at a temperature range of from 300 to 500° C. for from 5 to 60 minutes.

Figure 3A:
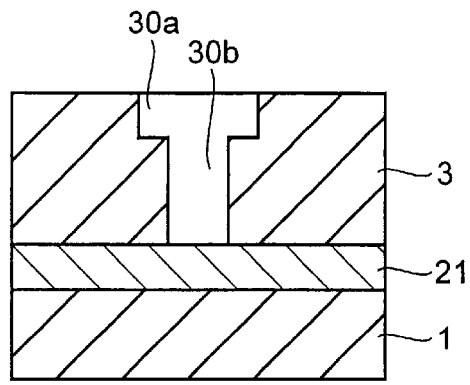
FIGS. 3A to 3C are cross sectional views showing a damascene process.
Figure 3B:
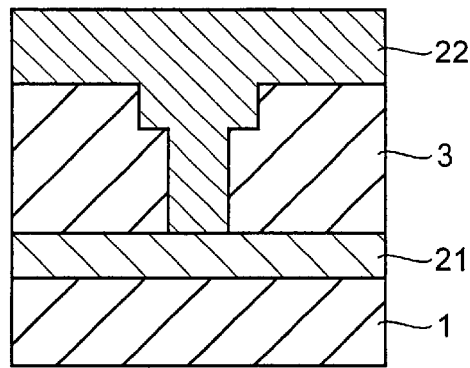
Figure 3C:
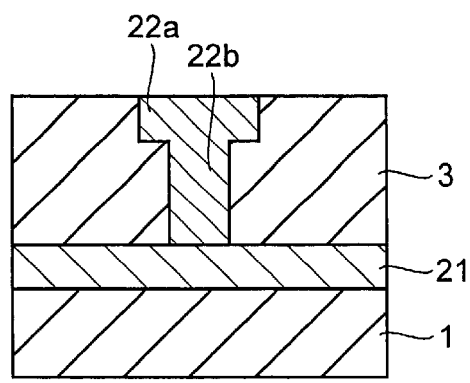

The process of the damascene process shown in item (7) is explained with reference to FIGS. 3A, 3B and 3C. As shown in FIG. 3A, a conductive layer (first wiring layer) 21 is formed on a substrate 1, and an insulating film 3 as an interlayer insulating film is formed. The insulating film 3 is etched by the photolithographic process to form a groove 30a in which a second wiring layer is filled, and a via hole 30b in which a conductive material connecting the first wiring layer and the second wiring layer is filled. As shown in FIG. 3B, a conductive layer 22 is formed on the insulating film 3 by sputtering or electrolytic plating. At this time, the conductive material is filled in the groove 31a and the via hole 30b. As shown in FIG. 3C, the conductive layer 22 is etched by chemical mechanical polishing or reverse sputtering to remove the part present on the insulating film 3, so as to obtain the state where a second wiring layer 22a and a via conductive material 22b are embedded in the insulating film 3. Thus, the damascene process can be applied to the insulating film of the invention. This means that a metallic wiring can be embedded by a photolythographic process, and the insulating film 3 functions as a stopper when the conductive layer 22 is etched by chemical mechanical polishing or reverse sputtering.

Figure 4:
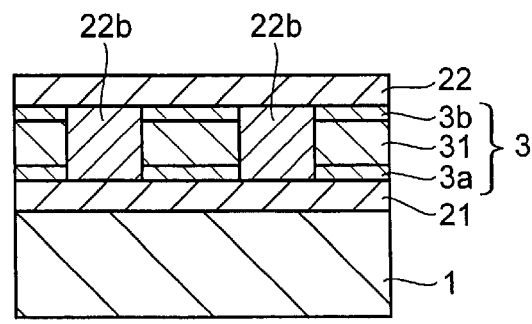
FIG. 4 is a cross sectional view showing an embodiment in which an insulating film of the invention is used as an interlayer insulating film of a semiconductor device.

A constitutional example of an embodiment in which the insulating film of the invention is used as an interlayer insulating film of a semiconductor device is shown in FIG. 4. In FIG. 4, a conductive layer (first wiring layer) 21, an insulating film 3 and a conductive layer (second wiring layer) 22 are formed on a substrate 1 in this order, and the conductive layer 21 and the conductive layer 22 are electrically connected by a via conductive material 22b filled in a contact hole piercing the insulating film 3. The insulating film 3 is an interlayer insulating film, and, in the embodiment shown in FIG. 4, has a constitution in that inorganic insulating films 3a and 3b are accumulated as sandwiching an insulating film 31 of the invention. The inorganic insulating films 3a and 3b also has functions as a mask for pattern forming, a reinforcing layer for adhesiveness and an anti-hygroscopic film, and generally comprise silicon oxide or silicon nitride. The conductive layer 21 in contact with the substrate 1 generally comprises Al, and the conductive layer 22 not in contact with the substrate 1 generally comprises Cu, Al—Cu or Al—Si—Cu. The via conductive material 22b generally comprises W or Cu since it must have gap fill property. The thickness of the conductive layers 21 and 22 is about from 50 to 500 nm, that of the inorganic insulating films 3a and 3b is about from 50 to 200 nm, and that of the insulating film 31 of the invention is about from 200 to 500 nm. The diameter of the via conductive material 22b is generally from 100 to 500 nm.

In an interlayer insulating film using SOG (spin on glass), a laminated structure where an SOG film is sandwiched by inorganic insulating films has been known. However, since the SOG film absorbs moisture in the SOG laminated structure, moisture is released from the SOG film when wiring (via conductive material) is formed in the adjacent via hole. Due to such moisture release, W absorbs moisture, and conductive failure sometimes occurs. On the other hand, because the insulating film of the invention is extremely low in water absorption, such conductive failure is difficult to occur.

In the constitutional example shown in FIG. 4, while the conductive layers (wiring layers) has a 2-layer structure, the insulating film of the invention can be applied to a constitution having 3 or more conductive layers. The inorganic insulating films 3a and 3b are not necessary and can be provided depending on necessity.

The production process of tetrafluoro-[2,2]-paracyclophane represented by the structural formula (II) used on forming the insulating film of the invention by the CVD process is not particularly limited, and it can be synthesized according to the following route as shown in Unexamined Published Japanese Patent Application No. 9-25252.

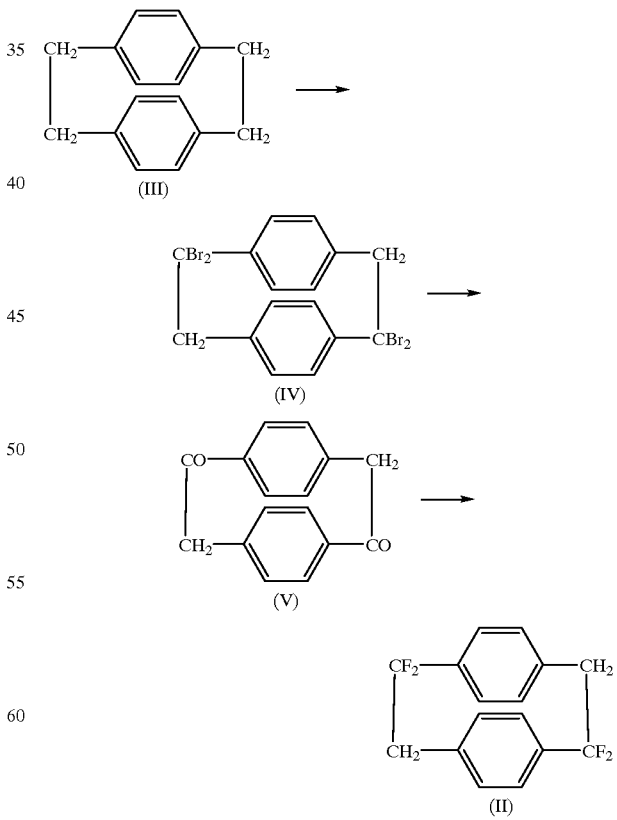

[2,2]-Paracyclophane represented by the structural formula (III) used as a starting raw material in this synthesis route is available from Daisan Kasei Co., Ltd. The starting raw material is reacted with N-bromosuccinic imide in an inert solvent in the presence of a peroxide catalyst, under irradiation of an ultraviolet ray, or under the combination use of a peroxide catalyst and ultraviolet ray irradiation, to obtain tetrabromo-[2,2]-paracyclophane represented by the structural formula (IV). Diketone-[2,2]-paracyclophane represented by the structural formula (V) is obtained by reacting tetrabromo-[2,2]-paracyclophane represented by the structural formula (IV) with sodium acetate or silver acetate in an acetic acid solvent. By reacting diketone-[2,2]-paracyclophane represented by the structural formula (V) with a fluorination agent such as tetrafluoro sulfur and diethylaminosulfur trifluoride (DAST), tetrafluoro-[2,2]-paracyclophane represented by the structural formula (II) as the objective compound can be obtained.

On the reaction obtaining tetrabromo-[2,2]-paracyclophane represented by the structural formula (IV) from [2,2]-paracyclophane represented by the structural formula (III), a brominated compound represented by the structural formula (VI) is also formed according to the following scheme:

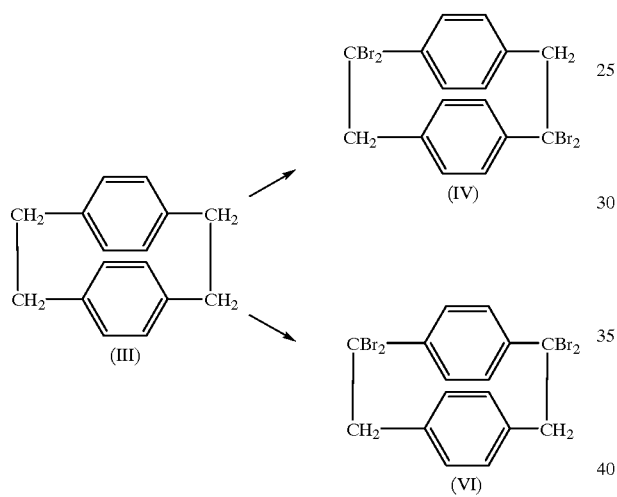

The brominated compound represented by the structural formula (VI) can be separated by utilizing difference in solubility in the solvent.

EXAMPLE

Example 1

The insulating film of the invention was produced and its dielectric constant was measured.

Tetrafluoro-[2,2]-paracyclophane represented by the structural formula (II) used as a raw material of the CVD process was produced according to the method described in Unexamined Published Japanese Patent Application No. 9-25252.

Poly-α,α-difluoroparaxylylene represented by the structural formula (I) was accumulated on a substrate having a flat surface by using a vacuum CVD apparatus having a constitution shown in FIG. 1. The conditions of accumulation were as follows:
Heating temperature in the evaporation chamber 102: 120° C.
Heating temperature in the decomposition chamber 103: 700° C.
Pressure on accumulation of the insulating film in the sample chamber 104: 4 Pa Temperature of the susceptor: −40° C.

The accumulation time was 30 minutes. After accumulation, annealing was conducted at 350° C. for 30 minutes. As a substrate, a copper substrate and a p-type semiconductor Si wafer were used. After forming an insulating film having a thickness of 1 μm on the substrates, an Al electrode was continuously formed by sputtering, to obtain samples for measurement.

The samples for measurement were subjected to measurement of capacitance between the Al electrode and the copper substrate or between the Al electrode and the p-type semiconductor Si wafer with a 1 MHz C-V plotter. As a result, the dielectric constant of the insulating film was in the range of from 2.1 to 2.7.

Example 2

The adhesive power of the insulating film was measured. By using an Si wafer as a substrate, an insulating film (thickness: 220 nm) of the invention was formed and annealed under the same conditions as in Example 1. An adhesive tape was adhered on the insulating film and then peeled off, but the insulating film was not peeled.

Example 3

The oxygen plasma ashing was conducted on the insulating film.

An insulating film (thickness: 560 nm) of the invention was formed on an Si wafer under the same conditions as in Example 1, and after accumulation, annealing was conducted at 350° C. for 75 minutes. After a mask was formed by photoresist, it was placed on a substrate stage of a plasma asher, and oxygen plasma ashing was conducted under the following conditions:
Oxygen gas flow amount: 90 SCCM
Vacuum degree: 8 Pa
RF power: 4.1 Watt/cm$^2$ (13.56 MHz)
Ashing rate: 113.3 nm/min After ashing, the insulating film was removed according to the mask pattern, and burning flaw was not observed on the insulating film after ashing.

Example 4

The step coverage and the gap fill property of the insulating film were measured.

Figure 5:
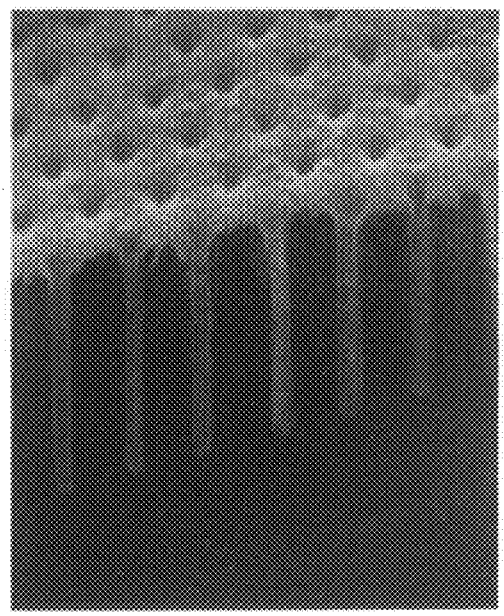
FIG. 5 is a scanning electron micrograph showing a cross section of a substrate having an insulating film of the invention formed thereon.
Figure 6:
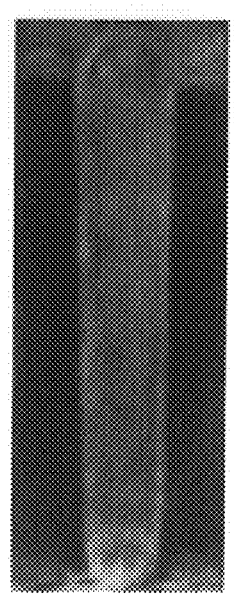
FIG. 6 is a scanning electron micrograph showing a cross section of a substrate having an insulating film of the invention formed thereon.

An insulating film (thickness: 250 nm) of the invention was formed on an Si wafer having a via hole having an opening diameter of 0.18 μm and an aspect ratio of 8, to fill the insulating film in the via hole. The conditions for accumulation of the insulating film were the same as in Example 1. After forming the insulating film, the substrate was cut at a face perpendicular to the main plane of the substrate. Al was deposited on the cut surface, which was then observed by a scanning electron microscope. A scanning electron micrograph thus obtained is shown in FIG. 5, and an enlarged view thereof is shown in FIG. 6. In FIGS. 5 and 6, a part having a high brightness is the insulating film. It is understood from these figures that the insulating film of the invention is filled in the via hole having a small opening diameter and a large aspect ratio without voids.

Figure 7:
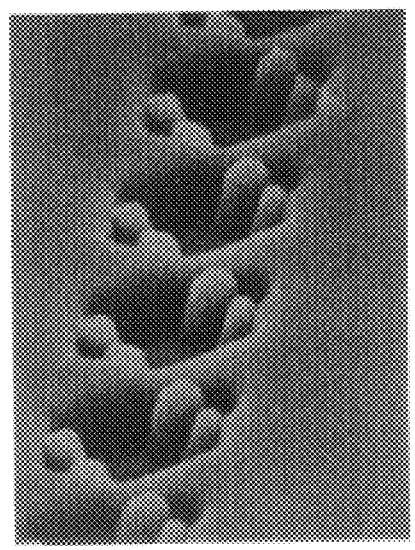
FIG. 7 is a scanning electron micrograph showing a cross section of a substrate having an insulating film of the invention formed thereon.
Figure 8:
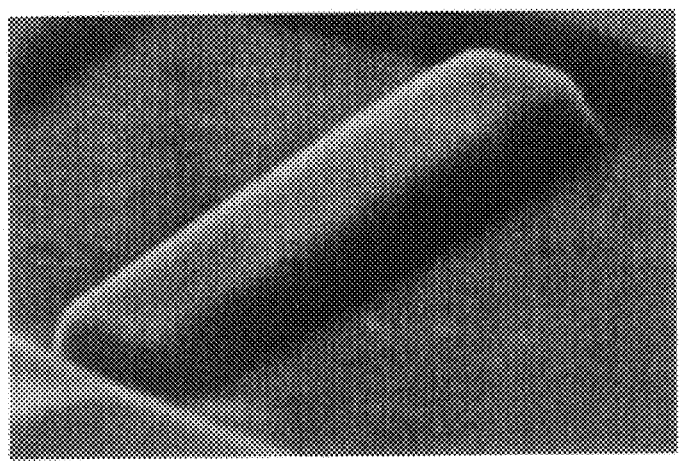
FIG. 8 is a scanning electron micrograph showing a cross section of a substrate having an insulating film of the invention formed thereon.

The insulating film of the invention was formed on a substrate having a surface of a step structure containing complicated unevenness. The conditions for accumulation of the insulating film were the same as in Example 1. Scanning electron micrographs after the formation of the insulating film are shown in FIGS. 7 and 8. It is understood from these figures that in the insulating film, a bridge connecting protrusions of the unevenness is not observed, and the formation of voids is not observed.

Example 5

Water absorption of the insulating film was measured.

The insulating film (thickness: 220 nm) of the invention was formed on an Si substrate under the same conditions as in Example 1. The resulting samples for measurement were allowed to stand in the air (23° C., 65% RH) for 48 hours. They were then annealed in an electric furnace in a nitrogen atmosphere for 30 minutes. The annealing temperature was 300° C., 350° C. or 400° C. They were then further allowed to stand in the air for 48 hours. A part of samples was not subjected to the annealing but continuously allowed to stand in the air for 96 hours.

Figure 9:
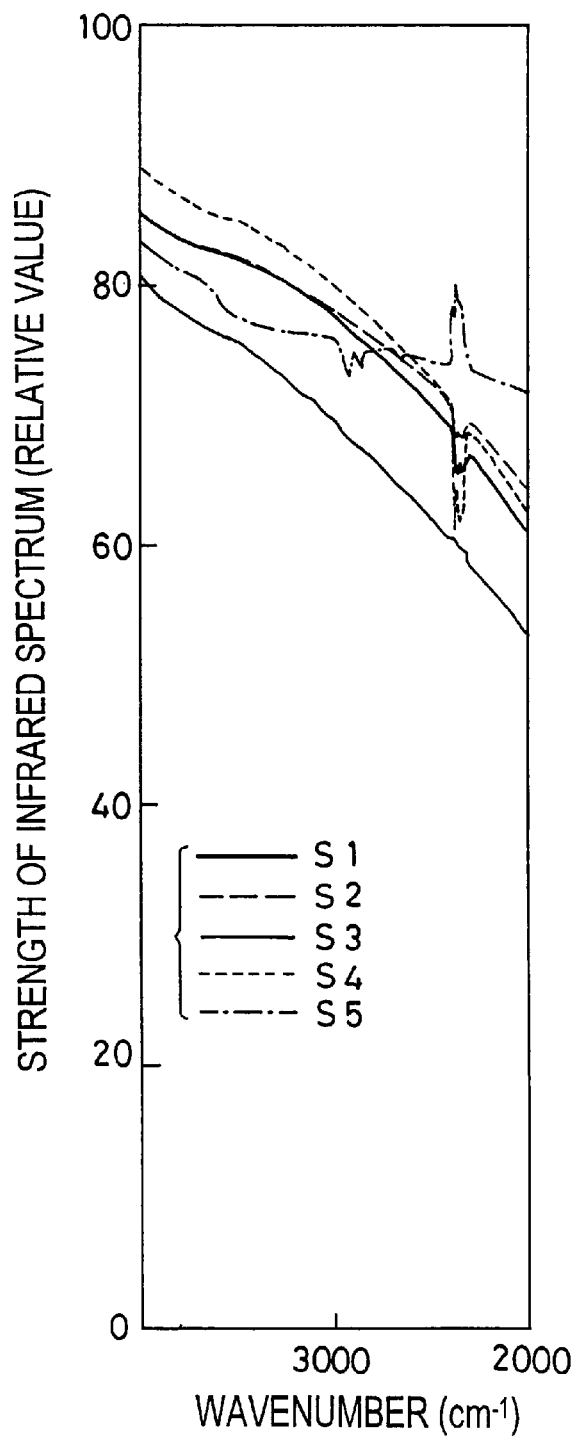
FIG. 9 is a graph showing an infrared spectrum of an insulating film of the invention for determining water absorption.

The insulating film of the samples was measured for infrared spectrum to determine the change in water absorption. The results are shown in FIG. 9. The heat history corresponding to the spectra S1 to S4 is as follows:
S1: Continuously allowed to stand in the air
S2: Annealing temperature of 300° C.
S3: Annealing temperature of 350° C.
S4: Annealing temperature of 400° C.
The spectrum S5 is for an aluminum base of an infrared spectroscope.

It is understood from FIG. 9 that change in wave shape of an OH group (appearing near 3,300 $cm^{-1}$) due to water absorption is not observed in all the insulating films having any heat history. Accordingly, the insulating film of the invention exhibits substantially no water absorption immediately after the film formation and after suffering heat history by annealing.

Example 6

The insulating film of the invention was applied to the damascene process.

Figure 10:
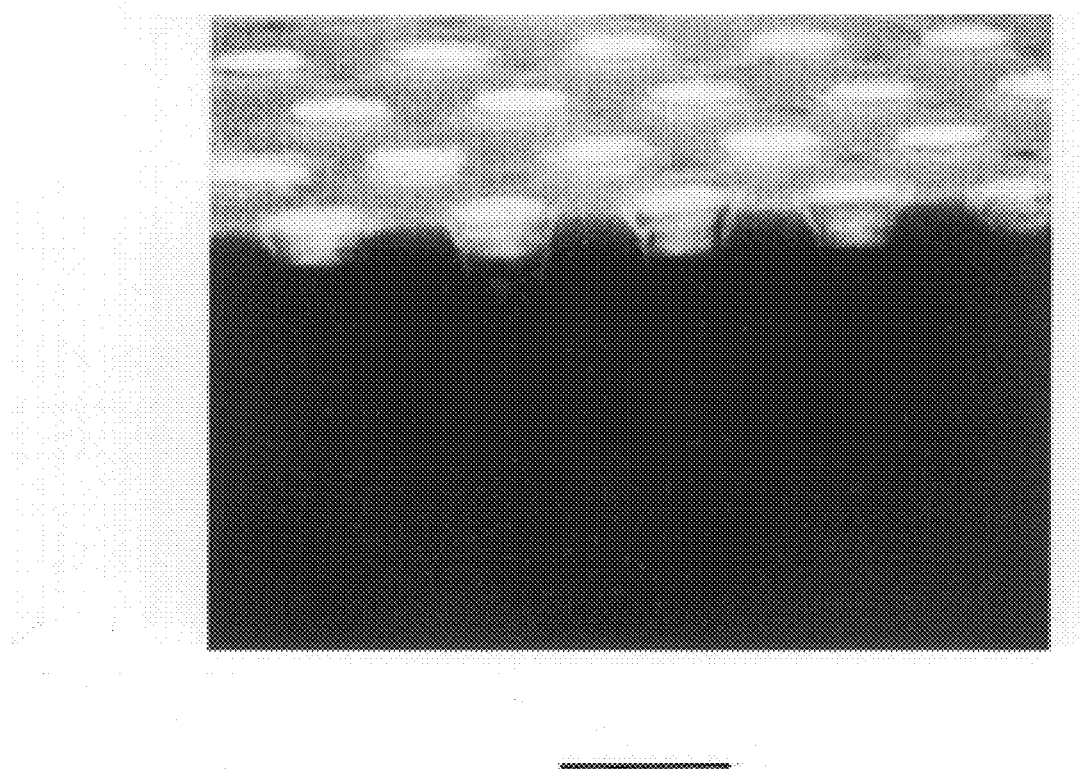
FIG. 10 is a scanning electron micrograph showing a cross section of a substrate having an insulating film of the invention formed thereon.

An insulating film (thickness: 350 nm) of the invention was formed on an Si wafer under the same conditions as in Example 1, and subjected to annealing under the same conditions as in Example 1. After forming a via hole in the insulating film, a Cu conductive layer was formed on the insulating film by sputtering. The diameter of the via hole was 0.25 $\mu$m. The Cu conductive layer was then etched by chemical mechanical polishing. As a result, the polishing was stopped at the surface of the insulating film, and a state, in which a copper plug having a flat surface was filled in the via hole of the insulating film, was obtained. The scanning electron micrograph after polishing is shown in FIG. 10.

In the present invention, poly-$\alpha,\alpha$-difluoroparaxylylene is applied to an interlayer insulating film of a semiconductor device. Accordingly, the capacitance coupling is lowered, and high-speed and normal operation can be ensured in a semiconductor device having a fine circuit pattern.

What is claimed is:

1. A semiconductor device comprising an interlayer insulating film consisting essentially of poly-$\alpha,\alpha$-difluoroparaxylylene.

2. The semiconductor device according to claim 1, wherein the insulating film exhibits a step coverage of from 0.4 to 0.9.

3. The semiconductor device according to claim 1, wherein the insulating film fills a gap having a depth D, an opening width L, and a ratio of D/L of 1 or more.

4. The semiconductor device according to claim 1, wherein the insulating film has been patterned by ashing with an oxygen plasma.

5. The semiconductor device according to claim 1, wherein the insulating film has a dielectric constant of from 2.1 to 2.7.

6. The semiconductor device according to claim 1, wherein a polymerization degree of the poly-$\alpha,\alpha$-difluoroparaxylylene is 1000 or more.

7. The semiconductor device according to claim 3, wherein the opening width L is 0.25 $\mu$m or less.

8. A method of making a semiconductor device, the method comprising vapor depositing an insulating film consisting essentially of poly-$\alpha,\alpha$-difluoroparaxylylene on a substrate, and forming the semiconductor device of claim 1.

* * * * *